(12) United States Patent  
Huang et al.

(10) Patent No.: US 7,474,565 B2  
(45) Date of Patent: Jan. 6, 2009

(54) PROGRAMMING SCHEME FOR NON-VOLATILE FLASH MEMORY

(75) Inventors: Chun-Jen Huang, Tainan (TW); Chia-Jung Chen, Chiayi County (TW); Hsin-Yi Ho, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 3 days.

(21) Appl. No.: 11/636,920

(22) Filed: Dec. 11, 2006

(65) Prior Publication Data

US 2008/0137427 A1 Jun. 12, 2008

(51) Int. Cl.
  *G11C 11/34* (2006.01)
  *G11C 16/04* (2006.01)
(52) U.S. Cl. ............................. 365/185.19; 365/185.28
(58) Field of Classification Search ............ 365/185.19, 365/185.28
  See application file for complete search history.

(56) References Cited

U.S. PATENT DOCUMENTS

| 5,218,569 | A | 6/1993 | Banks | |
|---|---|---|---|---|
| 5,293,560 | A | 3/1994 | Harari | |
| 6,011,725 | A | 1/2000 | Eitan | |
| 6,046,934 | A | 4/2000 | Lin | |
| 6,888,745 | B2 | 5/2005 | Ehiro et al. | |
| 6,920,066 | B2 * | 7/2005 | Pascucci et al. | 365/185.03 |
| 6,961,267 | B1 * | 11/2005 | Fastow et al. | 365/185.28 |
| 7,054,193 | B1 * | 5/2006 | Wong | 365/185.03 |
| 7,139,192 | B1 * | 11/2006 | Wong | 365/185.03 |

* cited by examiner

*Primary Examiner*—Ly D Pham
(74) *Attorney, Agent, or Firm*—Jianq Chyun IP Office

(57) ABSTRACT

An embodiment of the present invention involves a method of programming a memory cell. The memory cell is in a first state having a maximum initial threshold voltage. The memory cell is to be programmed to one of a plurality of states having a higher target threshold voltage relative to the maximum initial threshold voltage. There is a cue voltage between the maximum initial threshold voltage and the target threshold voltage. The memory cell has a drain region. The method includes applying a drain voltage to the cell by a programming pulse having a first width, determining whether the cell has reached the cue threshold voltage, and if the cell has reached the cue threshold voltage, changing the programming pulse width from the first pulse width to a second pulse width. The second pulse width is smaller than the first pulse width.

4 Claims, 4 Drawing Sheets

PROGRAMMING SCHEME FOR NON-VOLATILE FLASH MEMORY

BACKGROUND OF THE INVENTION

The present invention relates to non-volatile flash memory devices, and more particularly, to a method of programming multi-level flash memory cells.

Multi-level, or multi-bit, flash memory cells provide a solution for increasing the amount of data that can be stored on a memory device without consuming more space. Whereas a single-bit cell can store only two states, "on" and "off" (typically labeled "0" and "1"), a cell having n bits and using binary encoding is capable of storing up $2^n$ states. FIG. 1 shows a multi-bit cell as known in the art, generally labeled 10. The cell 10 has symmetrical source/drain regions 16 and 18 in connection with a semiconductor channel 20. The channel 20 and a gate 14 are separated from a charge trapping layer 12 by oxide regions 13 and 15, respectively. In this configuration, the left side of the charge trapping layer 12 is designated as the "left bit" 22, and the right side as the "right bit" 24.

As can be seen in FIG. 2, since the illustrated cell 10 has two bits, it may store up to $2^2$, or 4, states ("11", "01" "10", and "00"). Since accumulation of charge is the key to multi-bit programming, with more precise charge placement in the charge trapping layer 12, a higher number of bits and states may be achieved in cell 10, such as three bits ($2^3$=8 states), four bits ($2^4$=16 states), or more. Referring again to FIG. 1, the right bit 24 can be programmed by applying potential to the gate 14 and the region 18 (which serves as the drain) and grounding region 20 (which serves as the source). As electrons flow along the channel, they gain enough energy to tunnel through the oxide layer 13 to the charge trapping layer 12. The electrons tend to gather and are trapped in the portion of the charge trapping layer 12 nearest the drain 18, or the right bit 24. The left bit 22 may be programmed in a similar fashion, with region 16 serving as the drain and region 18 serving as the source.

The accumulation of charge in the right bit 24 alters the threshold voltage of the cell. FIG. 2 shows an example of threshold voltage distribution among states, as known in the art. The cell 10 is read by applying a potential that falls between the highest value of the most programmed state and the lowest value of the next highest erased state. For example, to read "01" (also referred to as Level 1 for purposes of illustration), a potential must be applied to the cell that is between the right-most point of the Level 1 distribution and the left-most point of the Level 2 distribution. This region can be referred to as a "read window". Methods of reading multi-bit cells are disclosed in detail in U.S. Pat. No. 6,011,725, which is incorporated herein by reference.

It is critically important when programming not to significantly overshoot the threshold voltage. An overshoot may result in a read error of the cell. Programming distributions seen in FIG. 2 (as opposed to single points) are the result of overshoot. The further the program cycle can overshoot the target threshold voltage, the wider the distribution will be. In order to most accurately program multi-bit cells, incremental stepping of the drain voltage is typically implemented. Uniform pulses are applied to the drain. Usually a program pulse is followed by a read operation to verify the level of the cell. As the desired threshold voltage is approached, the voltage step of the pulse is decreased. This still results in relatively wider programming distributions. The wider the distributions, the smaller the read windows. Applying potential to the cell invariably affects both bits due to a phenomenon known as the "second bit effect". Thus, applying a read potential to one bit could increase the charge on the other bit. With small read windows, that extra charge could be enough to bump the cell up to the next programmed state. In addition, if more states are desired for the cell, the margin for programming and read error shrinks rapidly.

Another prior art programming method, taking programming to Level 1 as an example, is illustrated in FIG. 3. During Step 1, the potential applied over a bit line to the drain (indicated as VPPD) is stepped incrementally while the potential applied over a word line to the gate (VCVP) is held constant. For example, when programming to Level 1, once the threshold voltage (Vt) reaches a cue level (PV1'), which is some $\Delta V$ below the target voltage (PV1), the method switches to Step 2. In Step 2, the gate voltage is reduced and then stepped incrementally while the drain potential is held constant until the end of the programming cycle. The purpose of the gate potential stepping is to slow down the program speed and thus tighten the programming distributions. However, the circuitry required to perform these operations becomes much more complex and burdensome.

It is therefore desirable to use a method for programming a multi-bit cell that reduces the programming distributions and expands the read windows without requiring complex circuitry and without altering the gate potential.

BRIEF SUMMARY OF THE INVENTION

An embodiment of the present invention involves a method of programming a memory cell. The memory cell is in a first state having a maximum initial threshold voltage. The memory cell is to be programmed to one of a plurality of states having a higher target threshold voltage relative to the maximum initial threshold voltage. There is a cue voltage between the maximum initial threshold voltage and the target threshold voltage. The memory cell has a drain region. The method includes applying a drain voltage to the cell by a programming pulse having a first width; determining whether the cell has reached the cue threshold voltage; and if the cell has reached the cue threshold voltage, changing the programming pulse width from the first pulse width to a second pulse width. The second pulse width is smaller than the first pulse width.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

DETAILED DESCRIPTION OF THE INVENTION

Figure 1:
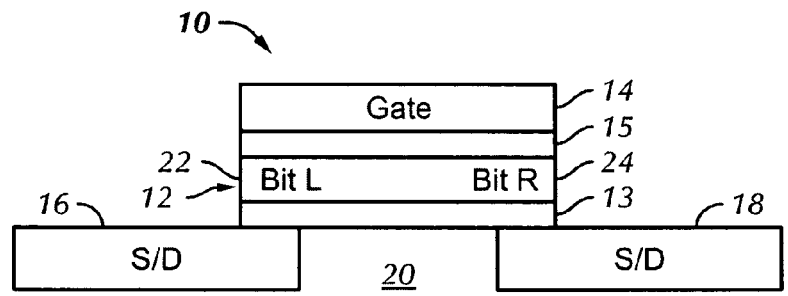
FIG. 1 shows a cross-sectional view of a multi-bit flash memory cell, as known in the art, for use in accordance with a preferred embodiment of the present invention.
Figure 2:
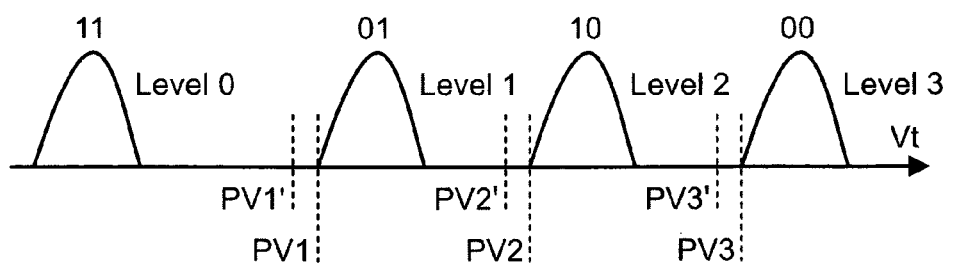
FIG. 2 is an exemplary plot of threshold voltages for potential programming states of a prior art multi-bit cell.
Figure 4:
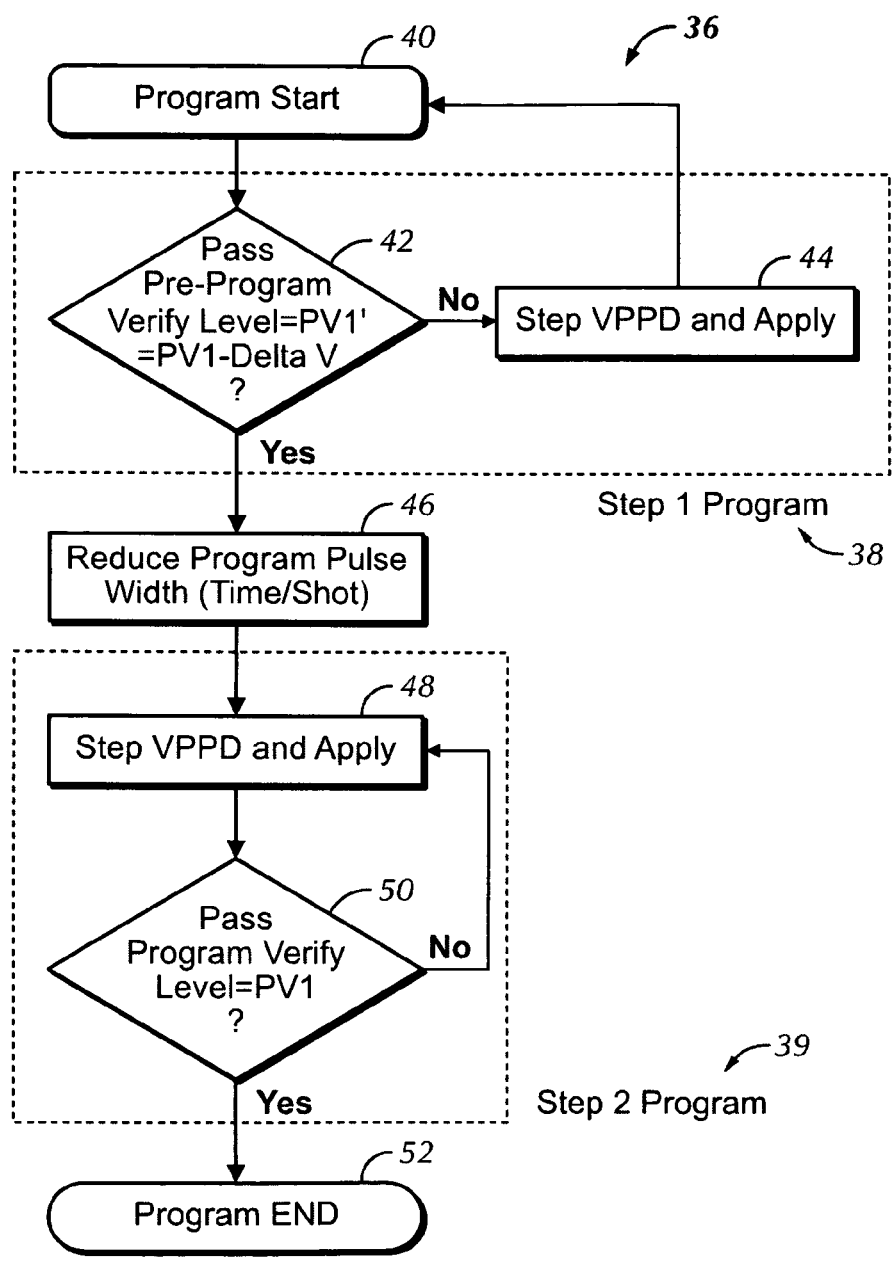
FIG. 4 is a flow chart representation of a preferred embodiment of the present invention.

FIG. 4 is a flow chart of a programming method in accordance with a preferred embodiment of the present invention, generally designated 36, for programming a multi-bit memory cell. Once the programming cycle begins 40, at block 42 the method verifies whether the cell level is equal to or greater than some cue voltage PV'. PV' is determined by subtracting a ΔV from the lowest value on the distribution curve of the desired state, or the target voltage (PV). ΔV should be set such that PV' falls between PV and the highest value on the distribution curve on the previous state. PV' preferably falls relatively closer to PV. As shown in FIG. 2, PV1' is much closer to PV1, the left-most side of the Level 1 distribution, than it is to the right-most side of the Level 0 distribution. The same is true of higher levels.

Referring again to FIG. 4, if the cell level has not yet reached PV', a pulse is applied at block 44. The drain potential VPPD is stepped by an appropriate amount and a pulse with a determined pulse width is applied to the cell. The pulse width is the amount of time that the potential is applied to the drain, and is typically on the order of less than one microsecond. Following the pulse, the method returns to block 42. This is repeated until the condition of block 42 (i.e., that the level be greater than or equal to PV') is met.

Upon successfully meeting the verification condition, the method moves to block 46. The program pulse width is reduced. For example, the pulse width may be reduced from 0.5 μs to 0.2 μs. Reducing the pulse width as PV is approached slows down the programming speed. This lowers the probability of a significant overshoot of PV. With such overshoots eliminated, the program distribution becomes much tighter. As a result, the second bit effect described earlier is lessened. The read window is much larger and allows room for the other bit to be affected without altering the state of the cell. The reduction may be performed by, for example, a logic control circuit (not shown).

Following the reduction 46, the drain voltage is again increased and applied 48, with the new, lower pulse width. The level is now read to determine whether it is greater than or equal to PV 50. If not, the program cycle returns to block 48 and the process repeats until the cell level equals or passes PV. Upon such occurrence, the program cycle ends 52. For purposes of comparing this preferred embodiment of the present invention to the prior art, Step 1 is indicated at 38 in FIG. 4, and encompasses level verification 42 and pulse application 44, including consecutive iterations as required. Step 2, designated 39, occurs after reduction of the pulse width 46 and encompasses pulse application 48 and level verification 50, including consecutive iterations as required.

Figure 3:
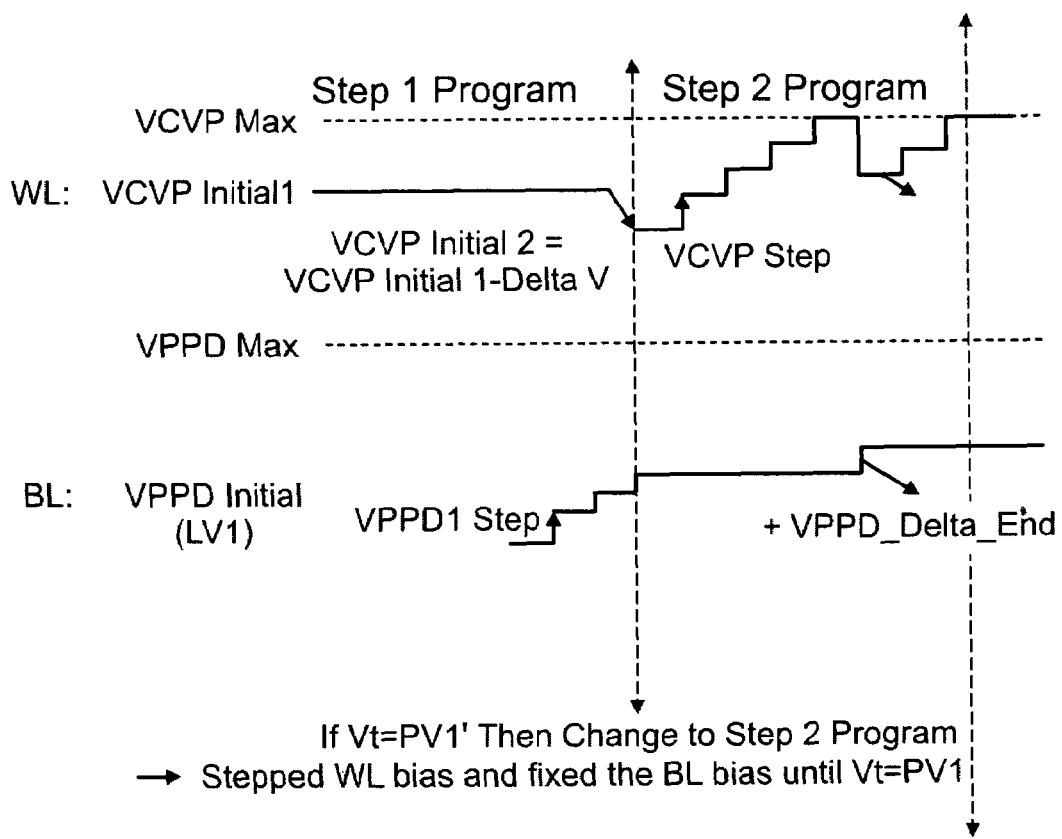
FIG. 3 is an example of a prior art method of programming a multi-bit memory cell.
Figure 5:
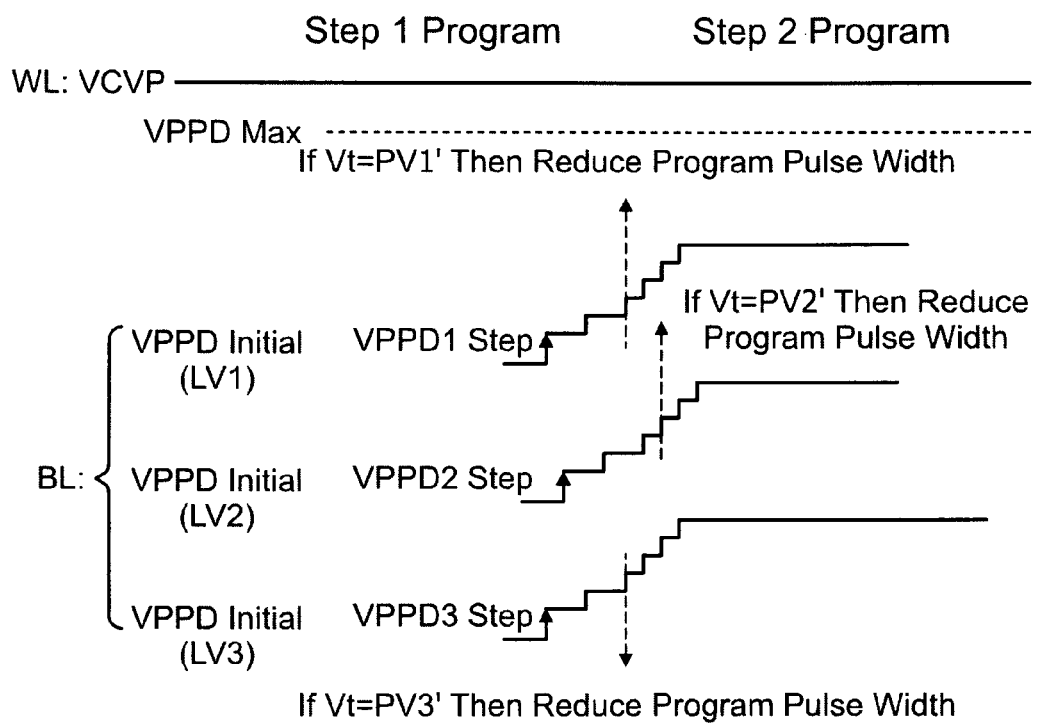
FIG. 5 is another diagrammatic representation of a preferred embodiment of the present invention.

Referring to FIG. 5, a diagram similar to that of the prior art method in FIG. 3 is shown. It can immediately be seen that the method described herein is less complex than the method shown in FIG. 3. The gate potential VCVP, for example, is held constant through both Steps 1 and 2 (38 and 39 in FIG. 4). Similarly, there is no requirement to fix the drain potential VPPD for a period during Step 2. Steps 1 and 2 for the drain are virtually identical except that Step 2 is done at a lower pulse width than Step 1, as indicated in the example on the diagram when Vt=PV1', PV2', or PV3'.

The method described herein may be used in conjunction with memory cells constructed of N or P type semiconductor channels. The orientation for applying potentials (e.g., the location of ground, whether to apply positive or negative potential) for programming, reading, and erasing the bits must therefore be adjusted accordingly.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention.

What is claimed is:

1. A method of programming a memory cell in a first state having a maximum initial threshold voltage to one of a plurality of states having a higher target threshold voltage relative to the maximum initial threshold voltage, wherein there is a cue threshold voltage between the maximum initial threshold voltage and the target threshold voltage, the memory cell having a drain, the method comprising:
   (a) applying a drain voltage in a form of a programming pulse having a first width to the drain of the cell;
   (b) determining whether the cell has reached the cue threshold voltage;
   (c) if the cell has reached the cue threshold voltage, changing the programming pulse width from the first pulse width to a second pulse width, the second pulse width being smaller than the first pulse width; and
   (d) after step (b), if the cell has not reached the cue threshold voltage, increasing the drain voltage and repeating from step (a) with the increased drain voltage.

2. The method of claim 1, step (c) further comprising increasing the drain voltage and applying a programming pulse having the second pulse width.

3. The method of claim 2, further comprising:
   (e) after step (c), determining whether the cell has reached the target threshold voltage; and
   (f) if the cell has not reached the target threshold voltage, increasing the drain voltage, applying a programming pulse having the second pulse width, and repeating from step (e).

4. The method of claim 3, further comprising:
   (g) after step (e), if the cell has reached the target threshold voltage, completing the programming of the cell.

* * * * *